(12) United States Patent
Lozhkin

(10) Patent No.: US 8,004,358 B2
(45) Date of Patent: Aug. 23, 2011

(54) DISTORTION COMPENSATION DEVICE

(75) Inventor: Alexander N. Lozhkin, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/747,700

(22) PCT Filed: Jan. 30, 2008

(86) PCT No.: PCT/JP2008/051976
§ 371 (c)(1),
(2), (4) Date: Jun. 11, 2010

(87) PCT Pub. No.: WO2009/096040
PCT Pub. Date: Aug. 6, 2009

(65) Prior Publication Data
US 2010/0271124 A1  Oct. 28, 2010

(51) Int. Cl.
*H03F 1/26* (2006.01)
(52) U.S. Cl. ........................................ 330/149; 375/297
(58) Field of Classification Search ............... 330/149, 330/129, 136
See application file for complete search history.

(56) References Cited

U.S. PATENT DOCUMENTS

| 7,639,755 | B2 * | 12/2009 | Ishikawa et al. | 375/296 |
| 7,728,665 | B2 * | 6/2010 | Watanabe | 330/149 |
| 2001/0005402 | A1 | 6/2001 | Nagatani et al. | |
| 2008/0068191 | A1 * | 3/2008 | Maeda et al. | 340/635 |

FOREIGN PATENT DOCUMENTS

| JP | 2001189685 | 7/2001 |
| JP | 2001203539 | 7/2001 |
| JP | 2001284980 | 10/2001 |
| JP | 2003078360 | 3/2003 |
| JP | 3567148 | 6/2004 |
| JP | 2005020373 | 1/2005 |
| JP | 3939888 | 4/2007 |
| JP | 2007329766 | 12/2007 |

OTHER PUBLICATIONS

Altera "Digital Predistortion Reference Design" AN-310-1.0 [online], [Searched Jun. 11, 2007], Internet <URL: http://www.altera.com/ literature/an/an314.pdf> dated Jul. 2003.
International Search Report dated May 13, 2008 in corresponding International application No. PCT/JP2008/051976.

* cited by examiner

*Primary Examiner* — Henry Choe
(74) *Attorney, Agent, or Firm* — Murphy & King, P.C.

(57) ABSTRACT

A distortion in an amplified signal obtained by amplifying a first input signal, is compensated for by applying a correction factor to the first input signal. The correction factor is updated based on the first input signal and the amplified signal. Updating the correction factor is prohibited when a value of the first input signal is same as a value of a second input signal among a plurality of input signals input previous to the first input signal.

7 Claims, 6 Drawing Sheets

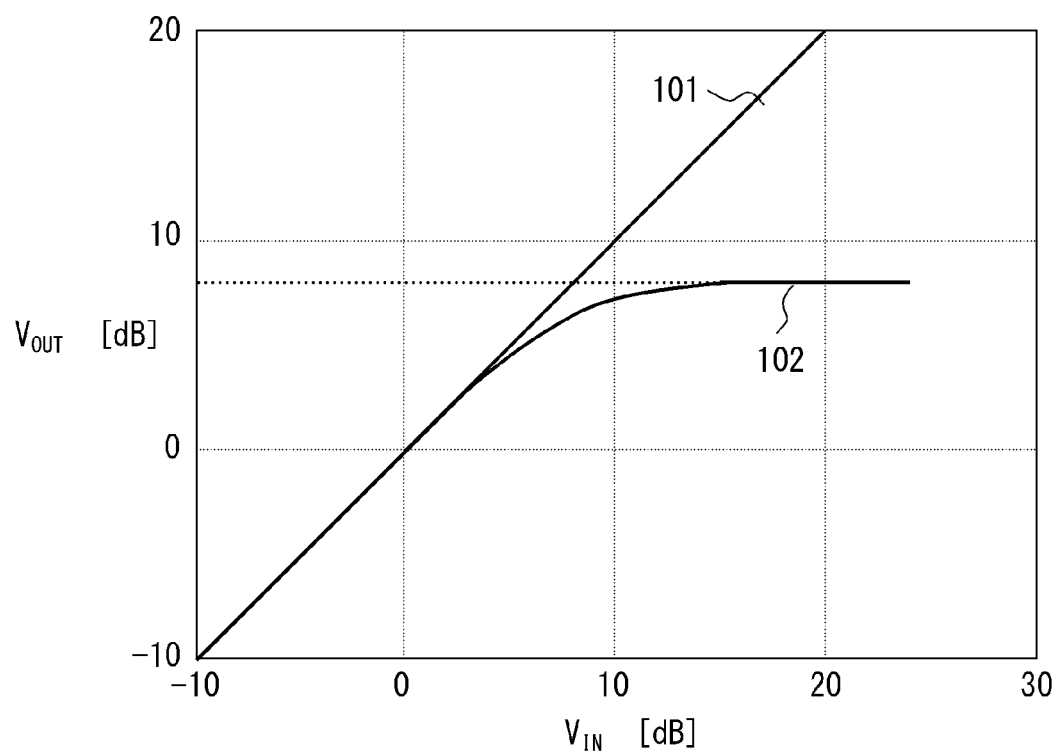
F I G. 1

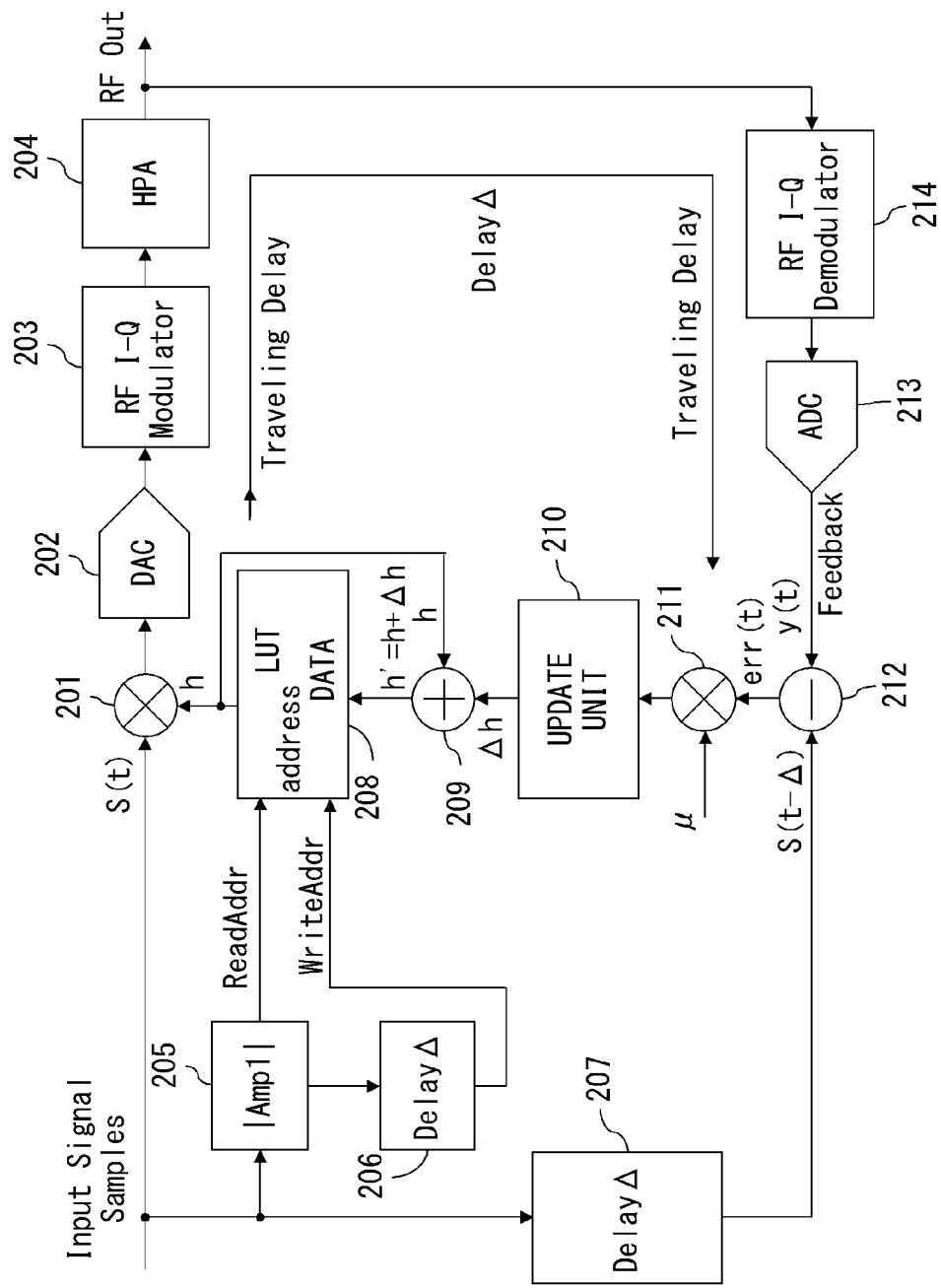
F I G. 2

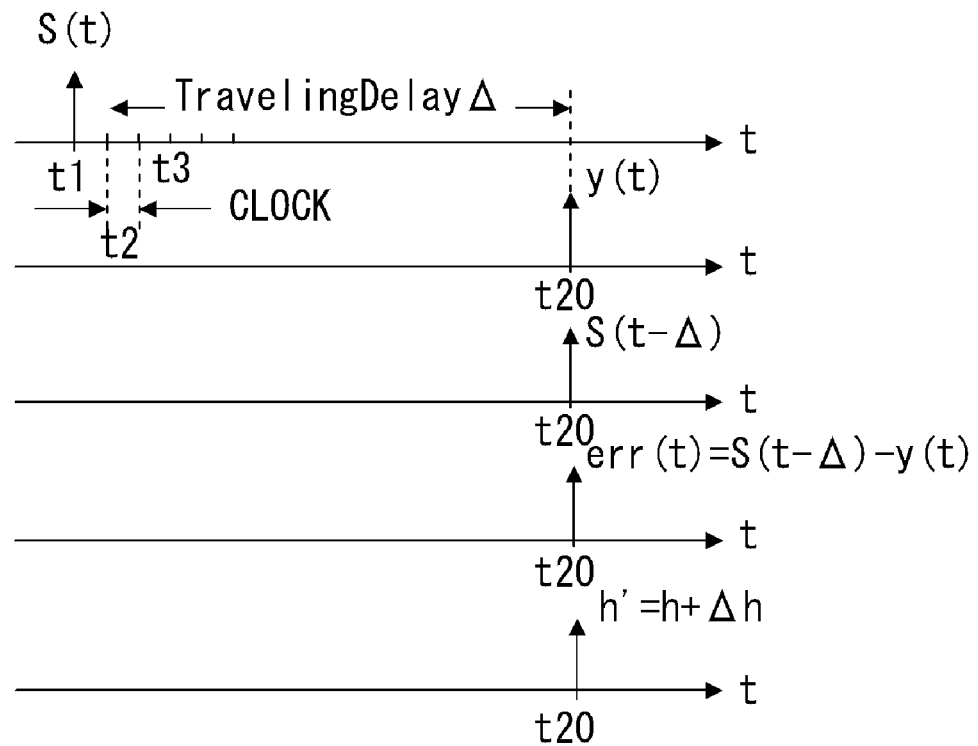
F I G. 3

DISTORTION COMPENSATION DEVICE

TECHNICAL FIELD

The present invention relates to a distortion compensation device for adaptively compensating for a nonlinear distortion in an amplified signal.

BACKGROUND ART

High power amplifiers (HPAs) for third-generation (3G) wireless communication systems and wireless local area network (WLAN) like IEEE811.x or IEEE816.x need high linearity at the HPA output, to achieve a high adjacent channel leakage ratio (ACLR) and low error vector magnitude (EVM). In addition, high efficiency is desirable. However, when operating with high efficiency, HPAs are the most nonlinear. Digital predistortion (DPD) is an efficient cost-effective means of compensating for HPA nonlinearity and retaining high efficiency.

The DPD reference design (see non-patent document 1) implements an adaptive lookup table (LUT) and applies correction values from the LUT to the incoming stream of samples. It also compares the measured output with the input, and uses this measurement to update the LUT, making the system adaptive.

For 3G and WLAN systems the DPD reference design can operate on up to four universal mobile telecommunication systems (UMTS) channels and correct 3rd and 5th order intermodulation products.

DPD is commonly used to linearize HPAs. Ideal HPAs are perfectly linear. Denoting input and output amplitude and a coefficient by $V_{IN}$, $V_{OUT}$ and k, respectively, their response can be described with the following equation (see line 101 in FIG. 1).

$$V_{OUT} = k \cdot V_{IN} \quad (1)$$

However, real HPAs as used in wireless system exhibit some nonlinearities and eventually reach saturation. This nonlinearity can be expressed as follows by adding the term $f_{NL}$ into the equation (1), where $f_{NL}$ is used to describe the nonlinearity (see curve 102 in FIG. 1).

$$V_{OUT} = f_{NL} \cdot k \cdot V_{IN} \quad (2)$$

The nonlinearity adversely affects the overall performance of a wireless system. It causes in-band distortion, which degrades the performance of the receiver, and out-of-band distortion, which degrades the performance of receivers in adjacent channels.

The task of the predistorter is to add predistortion before the power amplifier, which is exactly the inverse of the distortion caused by the power amplifier i.e. equals $f_{NL}^{-1}$. When combining the predistorter with the power amplifier, the terms $f_{NL}$ and $f_{NL}^{-1}$ cancel out, and the overall system can be described by the ideal HPA equation (1).

The nonlinearity of the HPA is affected by ageing and changes in the operating environment, in particular the temperature. For this reason, the nonlinearity changes over time, and the solution should be made adaptive such that the predistorter tracks the changes in behavior of HPA.

FIG. 2 describes the basic algorithm implemented in the reference design. The incoming complex sample S(t) at time t has correction factor h applied from LUT 208 at mixer 201 and then sent to radio frequency (RF) I-Q modulator 203 through digital-analog converter (DAC) 202. The address for the LUT 208 is derived from the input power by address calculator 205. The correction factor h is complex so the LUT 208 must contain two values for each location—the real part I and the imaginary part Q.

In the RF I-Q modulator 203, the sample is up-converted and sent to HPA 204. The HPA output is down-converted in RF I-Q Demodulator 214 and supplied to subtractor 212 through analog-digital converter (ADC) 213. The down-conversion allows us to measure the error, i.e., the difference between the input phase and magnitude of S(t), and the measured phase and magnitude at the HPA output. Obviously, delay unit 207 ensures that the input is compared to the correct output value by subtractor 212. The error signal output from the subtractor 212 is used to update the values currently stored in the LUT 208.

The input data signal is fed into the address calculator 205, which determines the address of the correction factor h in the LUT 208. This correction factor h modifies the input data signal. In the design shown in FIG. 2, power indexing is used to calculate the address.

The delay unit 207 delays the input sample S(t) by Δ and outputs the delayed sample S(t−Δ) to the subtractor 212. This delay compensates for the delay Δ of the predistorted signal traveling to the HPA 204 and then the HPA output making its way back to the feedback processing path. Thus the delay Δ is also because of the additional delays (latency) in the digital signal processing circuits such as multipliers and adders, and can exceed tens system clocks. The typical total traveling delay is 10-30 clocks, depending on the field programmable gate array (FPGA) used for the actual circuit and design properties.

In the simplest case, the LUT 208 must be updated every clock, i.e. the LUT 208 is updated every time when a new output sample y(t) is coming from ADC 213 and error signal err(t)=S(t−Δ)−y(t) is calculated. Such LUT updating strategy has a strong drawback. In fact, there is a significant problem with feedback loop dynamic performances and selection of the close loop gain.

As shown in FIG. 2, the HPA reaction for input stimulus S(t) is coming into the DPD circuit including adder 209, update unit 210, multiplier 211 and subtractor 212 after traveling delay. Typical DPD circuit determines the updated values of the correction factor h in the LUT 208 by comparing the feedback signal y(t) and the delayed input signal S(t−Δ). It is important that the feedback signal from HPA has to correspond to the stimulant input signal S(t−Δ).

The subtractor 212 outputs the error signal err(t) to the multiplier 211, the multiplier 211 multiplies the error signal err(t) by loop gain factor μ. Then the update unit 210 calculates difference Δh from the output of the multiplier 211 according to an adaptation algorithm. The adaptation algorithm is based on the least mean square (LMS) approach. The adder 209 adds the difference Δh to the current correction factor h and outputs updated correction factor h' to the LUT 208. Delay unit 206 delays the read address for h by the delay Δ and supplies it to the LUT 208 as the write address for h'.

The main problem for DPD loop is that there is a relatively big delay between input signal sample S(t) and HPA reaction on this sample that comes through feedback. Typically this delay can exceed 30 master clocks of large-scale integration (LSI) or FPGA easily, or be even longer in some narrow-band systems. Such long response time causes that loop has a strong overshooting and in order to achieve operating stability the loop gain factor μ must be very low. Such a low gain causes a long time for LMS algorithm convergence.

Lets describe this problem in details with reference to FIGS. 3 and 4. Assume that input sample S(t) comes to the DPD input at time t1. The input sample is fed into the address calculator 205, which determines the address of the LUT 208 i.e. values for complex correction factor h. This sample S(t) is multiplied before the DAC 202 by the correction factor h drawn from the LUT 208. After correction the sample is up-converted in the RF I-Q modulator 203 and sent to the HPA 204. Some portion of RF signal from HPA output is down-converted to measure the error signal err(t) after the delay $\Delta$.

Assume that the total traveling delay $\Delta$ equals 20 system clocks. The adaptation algorithm that is typically based on LMS approach, determines the value of the correction factor difference $\Delta h \approx err(t)$ by comparing the feedback signal y(t) at time t20 and the delayed input signal S(t−$\Delta$). Thus, after correction at time t20 a new value for correction factor h'=h+$\Delta$h becomes available. This new value h' is used for updating the LUT 208, i.e. h=h'. What is important about DPD is that the feedback signal y(t) as HPA reaction on the input signal S(t) comes with the traveling delay $\Delta$.

The problem with DPD shown in FIG. 2 arises if the input signal samples S(t) at the consecutive times t1, t2, t3 and so on, are the same and use the same address in LUT 208 i.e. the samples use the same complex correction factor h, the overshooting will happen. Thus, after the initial correction h'=h+$\Delta$h at time t20, additional corrections will happen at times t21, t22 and so on. This is because LUT updating algorithm h'=h+$\Delta$h is still using the old (delayed) data y(t). Therefore, instead of a single correction of $\Delta$h for h, due to the traveling delay, additional corrections at times t21, t22 and so on will happen. Thus, the complex correction factor in this example at time t22 will equal to h'=h+3$\Delta$h instead of correct value h'=h+$\Delta$h, i.e. there is the three times overshooting. Such overshooting causes DPD instability and increases time required for convergence of an LMS algorithm.

Patent Documents 1 and 2 relate to a distortion compensator with a predistorter.
Patent Document 1: Japanese Patent Application Publication No. 2001-189685
Patent Document 2: Japanese Patent Application Publication No. 2005-020373
Non-patent Document 1: "Digital Predistortion Reference Design," [online], [Searched Jun. 11, 2007], Internet <URL:http://www.altera.com/literature/an/an314.pdf>

DISCLOSURE OF INVENTION

An object of the present invention is to improve DPD transient performances due to unnecessary additional corrections of a correction factor to compensate for a nonlinear distortion in an amplified signal.

A distortion compensation device comprises a compensator, an update calculation unit and a control unit. The compensator compensates for a distortion in an amplified signal obtained by amplifying a first input signal, by applying a correction factor to the first input signal. The update calculation unit updates the correction factor based on the first input signal and the amplified signal. The control unit prohibits updating the correction factor when a value of the first input signal is same as a value of a second input signal among a plurality of input signals input previous to the first input signal.

An amplifier device comprises an amplifier unit, a compensator, an update calculation unit and a control unit. The amplifier unit amplifies a first input signal and outputs an amplified signal. The compensator compensates for a distortion in the amplified signal by applying a correction factor to the first input signal. The update calculation unit updates the correction factor based on the first input signal and the amplified signal. The control unit prohibits updating the correction factor when a value of the first input signal is same as a value of a second input signal among a plurality of input signals input previous to the first input signal.

According to such devices, update of the correction factor for several consecutive input signals that correspond to the same correction factor is prohibited. Therefore, unnecessary additional corrections of the correction factor are prohibited and DPD transient performances are improved.

BRIEF DESCRIPTION OF DRAWINGS

FIG. 1 is a graph showing a typical HPA amplitude-to-amplitude performances;
FIG. 2 is a configuration diagram showing a DPD reference design;
FIG. 3 is a timing chart showing a correction of a correction factor.

BEST MODE OF CARRYING OUT THE INVENTION

A best mode for carrying out the present invention is hereinafter described in detail with reference to the drawings.

Figure 5:
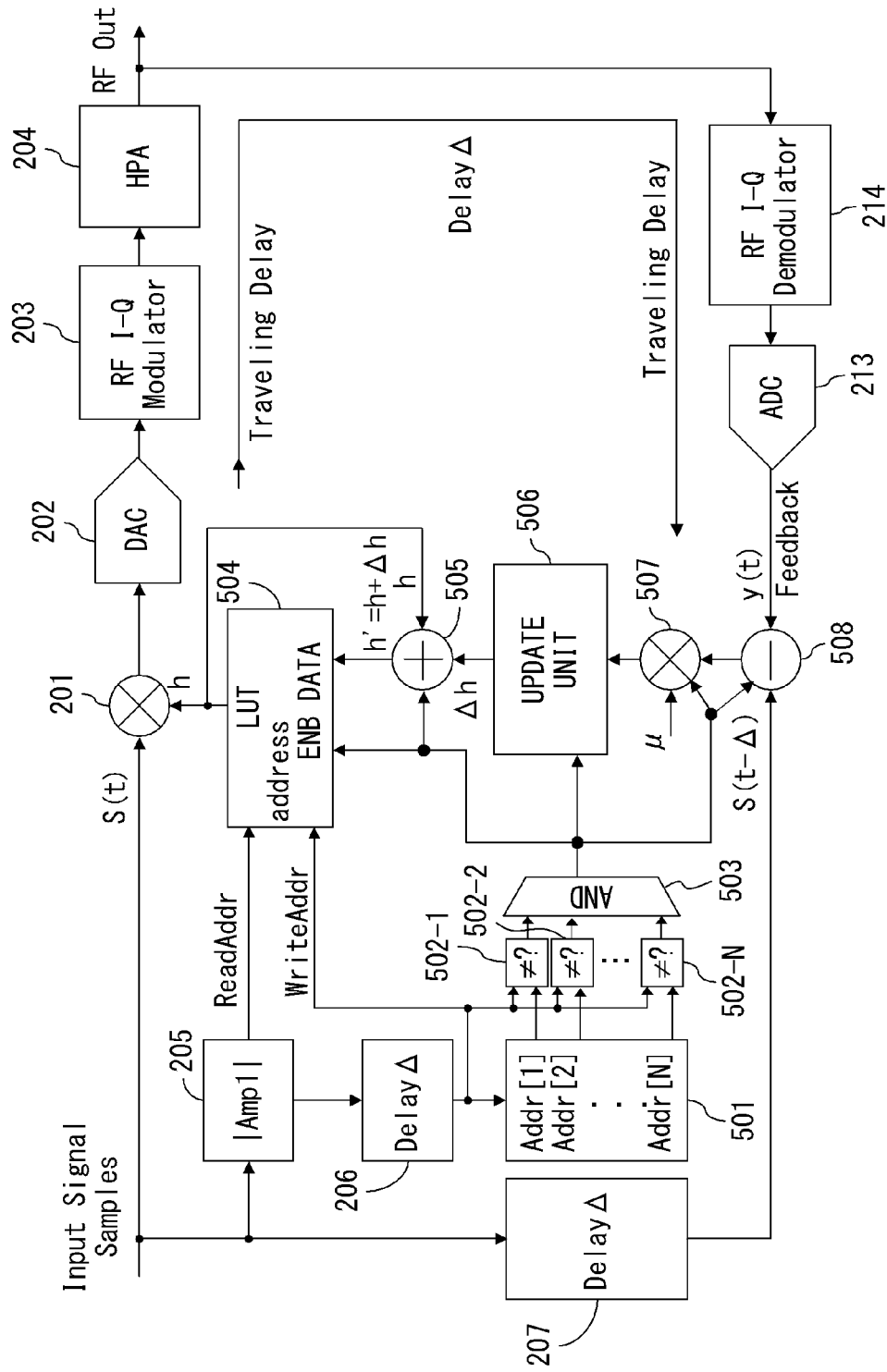
FIG. 5 is a configuration diagram of an amplifier device according to an embodiment of the present invention.

FIG. 5 shows a configuration of an HPA device with an advanced LUT updating algorithm according to an embodiment of the present invention. This HPA device has a configuration where the LUT 208, the adder 209, the update unit 210, the multiplier 211 and the subtractor 212 are replaced with LUT 504, adder 505, update unit 506, multiplier 507 and subtractor 508, respectively, in the configuration shown in FIG. 2. Furthermore, address storing unit 501, comparators 502-1 through 502-N and logical product (AND) circuit 503 are added, where N is a positive integer. The HPA device is used as a transmitter in a wireless communication system.

In order to prevent LUT updating every clock and allow the LUT updating only when $\Delta$h has the correct value, an additional ENB (enable) pin at the LUT 504 has been introduced. The control logic comprising the address storing unit 501, comparators 502-1 through 502-N and AND circuit 503 allows or prohibits the LUT updating using the ENB pin. The LUT updating is allowed only if samples at the previous N adjacent time intervals are different from the current sample. Generally speaking, each input sample S(t) corresponds to a unique LUT entry address denoted in FIG. 5 as Read Addr or Write Addr.

The address storing unit 501 is realized by a shift register or a memory device and stores N consecutive outputs from the delay unit 206, i.e. N write addresses Addr [1] through Addr [N] for the LUT 504. The comparator 502-i (i=1, 2, . . . , N) compares Addr [i] stored in the address storing unit 501 and an write address output from the delay unit 206, and outputs a comparison result. If both addresses are same, logic "0" (low level signal) is output from the comparator 502-i. If both addresses are different, logic "1" (high level signal) is output from the comparator 502-i. The AND circuit 503 outputs a logical product of the N comparison results output from the comparators 502-1 through 502-N to the LUT 504, adder 505, update unit 506, multiplier 507 and subtractor 508 as an update enable signal.

Therefore, the update enable signal has a value of logic "1" and becomes active when all addresses Addr [1] through Addr [N] at the N adjacent positions are different from the current write address output from the delay unit 206. In this case LUT updating at the LUT 504 is allowed. The update enable signal has a value of logic "0" and becomes inactive when any of Addr [1] through Addr [N] is same as the current write address. In this case LUT updating is prohibited to avoid overshooting of the correction factor h.

Figure 4:
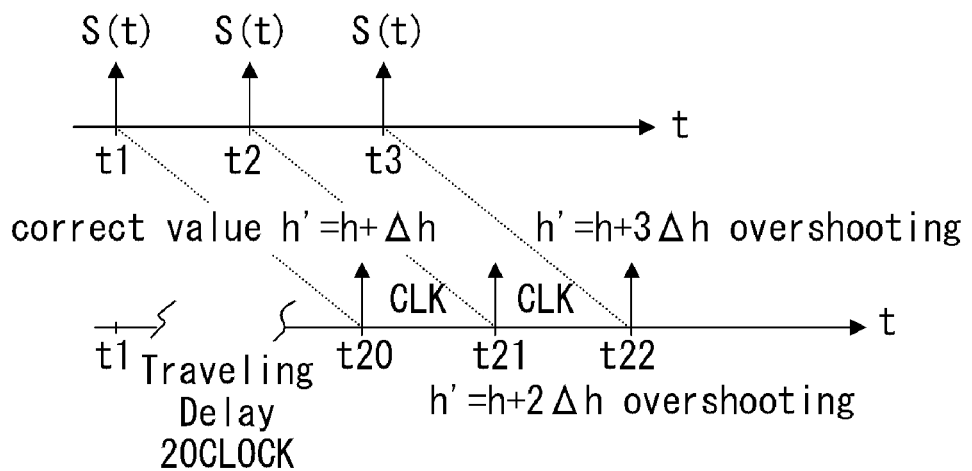
FIG. 4 is a timing chart showing additional corrections of a correction factor.
Figure 6:
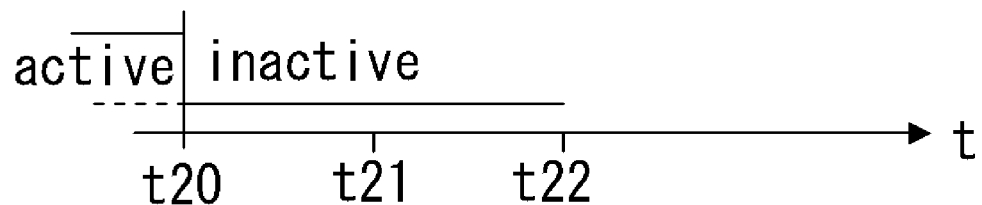
FIG. 6 is a timing chart showing a change of an update enable signal.

In the example shown in FIG. 4, the update enable signal is active until time t20 and becomes inactive afterwards as shown in FIG. 6. Thus, the overshooting at times t21 and t22 is avoided. The number N of the compared addresses is determined, for example, by trade-off between the overshooting improvement and a hardware cost.

Additionally, the logic "0" update enable signal suspends and sets to a "sleep mode" all circuits that calculates a new correction factor h'=h+Δh for the LUT 504. In the configuration shown in FIG. 5, the adder 505, update unit 506, multiplier 507 and subtractor 508 are set to the sleep mode and stop the calculations. Such a suspending operation provides the power consumption reduction and extends the battery lifetime.

As described above, in the general case LUT of DPD shown in FIG. 2 is updated every clock. Such permanent updating causes the problem with DPD stability and DPD settling time in the case when input samples correspond to the same LUT entry. In order to solve this problem an additional "enable" pin has been introduced in the LUT together with an additional control logic. Prohibiting LUT updating for the several consecutive samples that correspond to the same LUT entry improves DPD transient performances and reduces the power consumption.

The invention claimed is:

1. A distortion compensation device, comprising:
a compensator to compensate for a distortion in an amplified signal obtained by amplifying a first input signal, by applying a correction factor to the first input signal;
an update calculation unit to update the correction factor based on the first input signal and the amplified signal; and
a control unit to prohibit updating the correction factor when a value of the first input signal is same as a value of a second input signal among a plurality of input signals input previous to the first input signal.

2. The distortion compensation device according to claim 1, wherein
the compensator includes a plurality of correction factors with respective addresses, the update calculation unit updates the correction factor with a first address corresponding to the value of the first input signal, and the control unit prohibits updating the correction factor when the correction factor has already been updated based on the second input signal and the first address is same as a second address corresponding to the value of the second input signal.

3. The distortion compensation device according to claim 2, wherein
the control unit includes a storing unit to store a plurality of addresses corresponding to values of the plurality of input signals, a comparator unit to compare each of the plurality of addresses stored in the storing unit with the first address, and a logic circuit to output an active update enable signal to the compensator when all the plurality of addresses are different from the first address and an inactive update enable signal when at least one of the plurality of addresses is same as the first address.

4. The distortion compensation device according to claim 3, wherein
the logic circuit outputs the inactive update enable signal to the update calculation unit when at least one of the plurality of addresses is same as the first address, and the inactive update enable signal suspends an update operation of the update calculation unit.

5. The distortion compensation device according to claims 3 or 4, wherein
the comparator unit outputs a high level signal for each of the plurality of addresses when each of the plurality of addresses is not same as the first address and a low level signal for each of the plurality of addresses when each of the plurality of addresses is same as the first address, and the logic circuit outputs a logical product of a plurality of signals output from the comparator unit as the update enable signal.

6. An amplifier device, comprising:
an amplifier unit to amplify a first input signal and output an amplified signal;
a compensator to compensate for a distortion in the amplified signal by applying a correction factor to the first input signal;
an update calculation unit to update the correction factor based on the first input signal and the amplified signal; and
a control unit to prohibit updating the correction factor when a value of the first input signal is same as a value of a second input signal among a plurality of input signals input previous to the first input signal.

7. A distortion compensation method of compensating for a distortion in an output signal of an amplifier unit, comprising:
applying a correction factor to a first input signal;
amplifying the first input signal by the amplifier unit to obtain an amplified signal a distortion in which is compensated for by the correction factor;
updating the correction factor based on the first input signal and the amplified signal; and
prohibiting updating the correction factor when a value of the first input signal is same as a value of a second input signal among a plurality of input signals input previous to the first input signal.

* * * * *